United States Patent
Song et al.

(10) Patent No.: US 7,871,861 B2
(45) Date of Patent: Jan. 18, 2011

(54) STACKED INTEGRATED CIRCUIT PACKAGE SYSTEM WITH INTRA-STACK ENCAPSULATION

(75) Inventors: Sungmin Song, Inchon (KR); Junwoo Myung, Ichon-si (KR); Byoung Wook Jang, Yong-in (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 12/146,411

(22) Filed: Jun. 25, 2008

(65) Prior Publication Data

US 2009/0321908 A1    Dec. 31, 2009

(51) Int. Cl.
*H01L 21/00* (2006.01)
(52) U.S. Cl. .................. 438/122; 257/686; 257/777; 257/E25.006; 257/E25.013; 257/E25.021; 257/E25.027; 257/E23.085
(58) Field of Classification Search .................. 257/686, 257/625, 777, E25.005, E25.006, E25.013, 257/E25.021, E25.027, E23.085; 438/122
See application file for complete search history.

(56) References Cited

U.S. PATENT DOCUMENTS

| | | | |
|---|---|---|---|
| 5,904,497 A | 5/1999 | Akram | |
| 6,489,676 B2 * | 12/2002 | Taniguchi et al. | 257/698 |
| 6,919,627 B2 | 7/2005 | Liu et al. | |
| 6,933,598 B2 * | 8/2005 | Karnezos | 257/686 |
| 7,109,576 B2 | 9/2006 | Bolken et al. | |
| 7,129,113 B1 * | 10/2006 | Lin et al. | 438/109 |
| 7,176,561 B2 * | 2/2007 | Aoyagi | 257/686 |
| 7,187,068 B2 * | 3/2007 | Suh et al. | 257/685 |
| 7,198,980 B2 | 4/2007 | Jiang et al. | |
| 7,217,993 B2 * | 5/2007 | Nishimura | 257/686 |
| 2008/0169544 A1 * | 7/2008 | Tanaka et al. | 257/686 |

* cited by examiner

*Primary Examiner*—Jasmine J Clark
(74) *Attorney, Agent, or Firm*—Mikio Ishimaru

(57) ABSTRACT

A stacked integrated circuit package system includes: mounting a first integrated circuit over a first carrier; mounting a second integrated circuit package system having a second carrier with an intra-stack interconnect attached thereto and with the intra-stack interconnect over the first carrier and the first integrated circuit; and forming an intra-stack encapsulation between the first carrier and the second carrier surrounding the intra-stack interconnect.

19 Claims, 4 Drawing Sheets

STACKED INTEGRATED CIRCUIT PACKAGE SYSTEM WITH INTRA-STACK ENCAPSULATION

TECHNICAL FIELD

The present invention relates generally to an integrated circuit package system and more particularly to a stacked integrated circuit package system with encapsulation.

BACKGROUND ART

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". The needs for portable personal electronics, such as cell phones, digital cameras, music players, personal digital assistants (PDA's), and location-based devices are particularly acute and have further driven the need for increased integrated circuit density.

This increased integrated circuit density has led to the development of multi-chip packages in which more than one integrated circuit can be packaged. For example, package-on-package (POP) systems may be used to integrate and package stacks of circuits. A POP system may be manufactured from a top assembly and a bottom assembly where each assembly carries at least one integrated circuit.

However, in some cases, the bottom assembly may warp before or after the top assembly has been mounted. This may result in poor yields, device failures, or reduced device lifetimes due to a variety of problems such as compromised mechanical properties or poor electrical connectivity. Contemporary electronics expose integrated circuits, integrated circuit packages, and electronic subassemblies to more demanding and sometimes harsh environmental conditions, such as cold, heat, and humidity requiring integrated circuit packages to provide robust mechanical structures. The range of operating conditions may also cause warpage resulting in failure, field returns, and increased cost.

In some cases an underfill encapsulant material is applied in the gap directly between an integrated circuit (IC) chip stack and the bottom package carrier of the bottom assembly. This underfill encapsulation protects and covers the connections between the IC and the bottom package carrier.

Thus, a need still remains for a stacked integrated circuit package system that provides a low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package system including: mounting a first integrated circuit over a first carrier; mounting a second integrated circuit package system having a second carrier with an intra-stack interconnect attached thereto and with the intra-stack interconnect over the first carrier and the first integrated circuit; and forming an intra-stack encapsulation between the first carrier and the second carrier surrounding the intra-stack interconnect.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
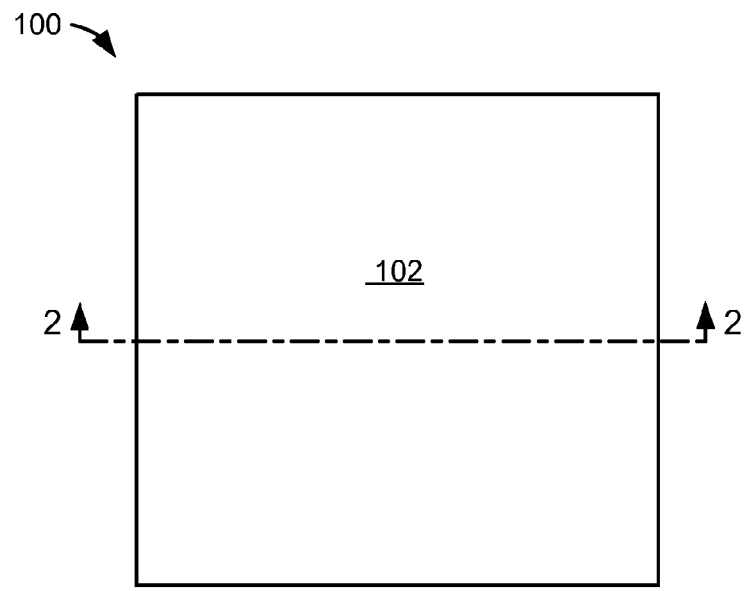
FIG. 1 is a top view of a stacked integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, or removal of the material or as required in forming a described structure. The term "system" as used herein means and refers to the method and to the apparatus of the present invention in accordance with the context in which the term is used.

Referring now to FIG. 1, therein is shown a top view of a stacked integrated circuit package system 100 in a first embodiment of the present invention. The top view depicts a top encapsulation 102, such as a cover including an epoxy molding compound. For illustrative purposes, the stacked integrated circuit package system 100 is shown having a square geometric configuration, although it is understood that the stacked integrated circuit package system 100 can have a different geometric configuration. For example, the stacked integrated circuit package system 100 can have a rectangular geometric configuration.

Figure 2:
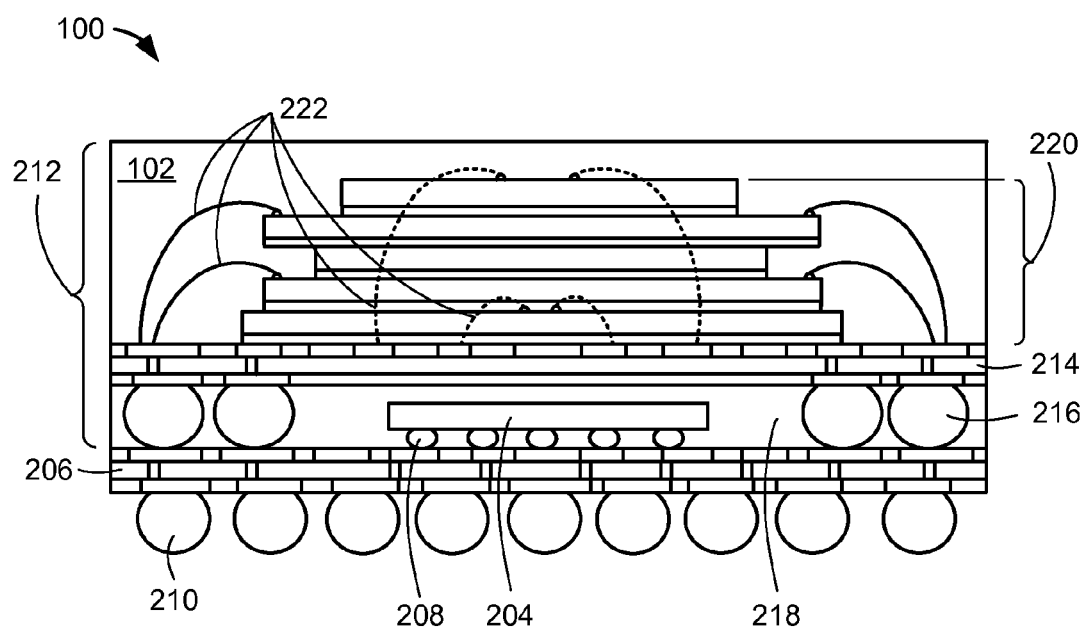
FIG. 2 is a cross-sectional view of the stacked integrated circuit package system along line 2-2 of FIG. 1.

Referring now to FIG. 2, therein is shown a cross-sectional view of the stacked integrated circuit package system 100 along line 2-2 of FIG. 1. The cross-sectional view depicts a first integrated circuit 204, such as a flip chip, can mount over a first carrier 206, such as a laminated substrate. First interconnects 208, such as solder bumps, can connect the first integrated circuit 204 and the first carrier 206. External interconnects 210, such as solder balls, can be attached below and to the first carrier 206.

A second integrated circuit package system 212, such as a packaged integrated circuit device, can mount over the first carrier 206 and the first integrated circuit 204. The second integrated circuit package system 212 can include a second carrier 214, such as a laminated substrate, and intra-stack interconnects 216, such as solder balls, attached below and to the second carrier 214. The intra-stack interconnects 216 can function as external interconnects with the second integrated circuit package system 212 mounted to the next system level (not shown), such as a printed circuit board. The first integrated circuit 204 can be between the intra-stack interconnects 216 and does impede the connections of the intra-stack interconnects 216 with the first carrier 206.

An intra-stack encapsulation 218, such as an underfill or an epoxy molding compound, can occupy an entire space between the first carrier 206 and the second carrier 214. The intra-stack encapsulation 218 can also surrounds the first integrated circuit 204 and the intra-stack interconnects 216. The intra-stack encapsulation 218 can function to mitigate or eliminate warpage of the stacked integrated circuit package system 100 by providing locking support of the first integrated circuit 204 and the intra-stack interconnects 216 as well as providing structural rigidity.

It has been discovered that the present invention provide a stacked integrated circuit package system having improved reliability and lower profile with the intra-stack encapsulation filling the space between the first carrier and the second carrier. The intra-stack encapsulation cooperates with the intra-stacking interconnects, the first carrier, the second carrier, and the first integrated circuit to provide structural planar rigidity. The structural planar rigidity mitigates or eliminates warpage of the stacked integrated circuit package system resulting in improved reliability. The intra-stack encapsulation between the first and second carriers do not require additional protective cover, such as an encapsulation, for the first integrated circuit or a separate interposer (not shown), such that the height of the stacked integrated circuit package system can be kept low.

The second integrated circuit package system 212 can include a second integrated circuit 220, such as a stack of integrated circuit die, mounted over the second carrier 214. Second interconnects 222, such as bond wires, can connect the second integrated circuit 220 and the second carrier 214. The second interconnects 222 can connect the individual integrated circuit in the stack to the second carrier 214.

For illustrative purposes, the second integrated circuit package system 212 is shown with the second integrated circuit 220 having wire bonded integrated circuit dice and connected with the second carrier 214 with the second interconnects 222 as bond wires. Although it is understood that the second integrated circuit package system 212 can have different types of integrated circuits in stack of the second integrated circuit 220 and different types of electrical interconnects in the stack. For example, the second integrated circuit 220 can represent a stack of disparate integrated circuits of different technologies, sizes, pre-packaged, or not packaged. As another example, the second integrated circuit 220 can also be a single device, such as single integrated circuit die.

The top encapsulation 102, such as a cover of epoxy molding compound, can be over the second carrier 214 covering the second integrated circuit 220 and the second interconnects 222. The top encapsulation 102 does not contact the intra-stack encapsulation 218. The top encapsulation 102 also cooperates with the intra-stack encapsulation 218, the intra-stack interconnects 216, the first carrier 206, and the second carrier 214 to provide structural rigidity to mitigate or eliminate warpage of the stacked integrated circuit package system 100.

Figure 3:
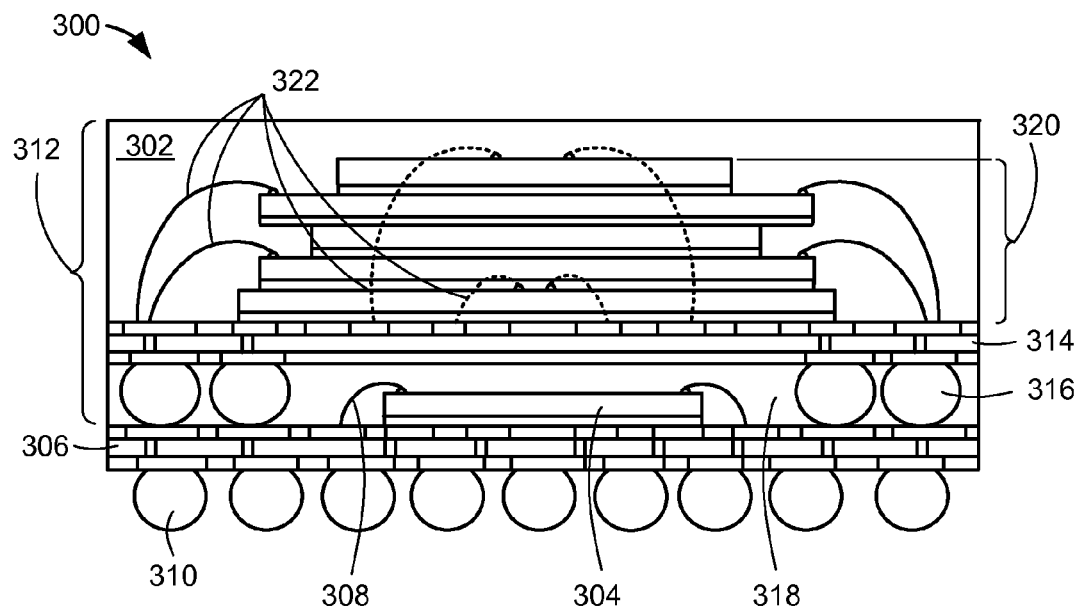
FIG. 3 is a cross-sectional view of a stacked integrated circuit package system exemplified by the top view of FIG. 1 in a second embodiment of the present invention.

Referring now to FIG. 3, therein is shown a cross-sectional view of a stacked integrated circuit package system 300 exemplified by the top view of FIG. 1 in a second embodiment of the present invention. The stacked integrated circuit package system 300 includes structural similarities to the stacked integrated circuit package system 100 of FIG. 2. The cross-sectional view depicts a first integrated circuit 304, such as an integrated circuit die, can mount over a first carrier 306. First interconnects 308, such as bond wires or ribbon bond wires, can connect the first integrated circuit 304 and the first carrier 306. External interconnects 310 can be attached below and to the first carrier 306.

A second integrated circuit package system 312 can mount over the first carrier 306 and the first integrated circuit 304. The second integrated circuit package system 312 can include a second carrier 314 and intra-stack interconnects 316 attached below and to the second carrier 314. The first integrated circuit 304 can be between the intra-stack interconnects 316 and does impede the connections of the intra-stack interconnects 316 with the first carrier 306.

An intra-stack encapsulation 318 can fill a space between the first carrier 306 and the second carrier 314. The intra-stack encapsulation 318 can also surround the first integrated circuit 304 and the intra-stack interconnects 316. The intra-stack encapsulation 318 is the same thickness between the first carrier 306 and the second carrier 314 as the intra-stack interconnects 316. The intra-stack encapsulation 318 can function to mitigate or eliminate warpage of the stacked integrated circuit package system 300 by providing locking support of the first integrated circuit 304 and the intra-stack interconnects 316 as well as providing structural rigidity.

The second integrated circuit package system 312 can include a second integrated circuit 320, such as a stack of integrated circuit die, mounted over the second carrier 314.

Second interconnects 322 can connect the second integrated circuit 320 and the second carrier 314. The second interconnects 322 can connect the individual integrated circuit in the stack to the second carrier 314.

A top encapsulation 302 can be over the second carrier 314 covering the second integrated circuit 320 and the second interconnects 322. The top encapsulation 302 does not contact the intra-stack encapsulation 318. The top encapsulation 302 also cooperates with the intra-stack encapsulation 318, the intra-stack interconnects 316, the first carrier 306, and the second carrier 314 to provide structural rigidity to mitigate or eliminate warpage of the stacked integrated circuit package system 100.

Figure 4:
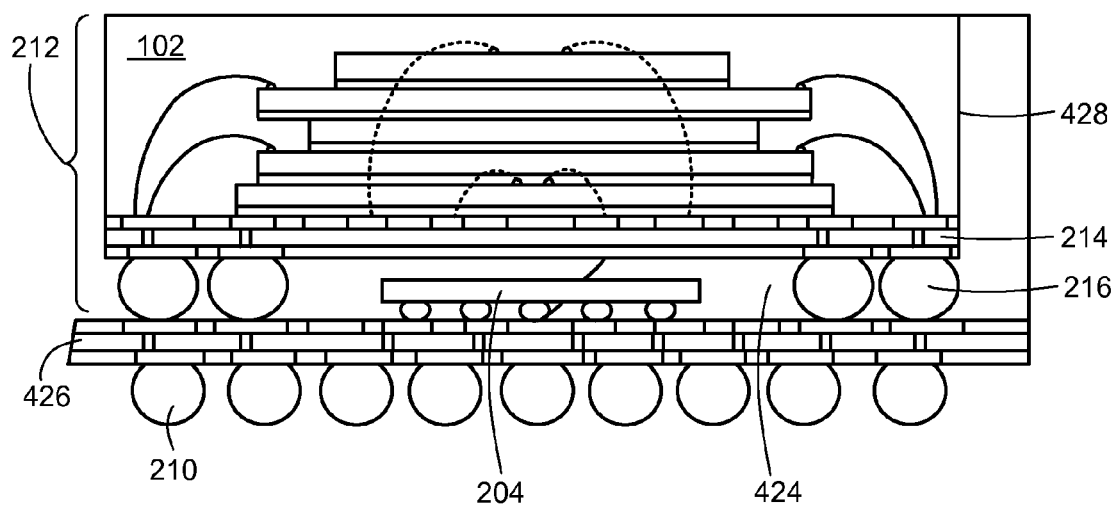
FIG. 4 is a cross-sectional view of the stacked integrated circuit package system of FIG. 2 in molding an intermediate encapsulation.

Referring now to FIG. 4, therein is shown a cross-sectional view of the stacked integrated circuit package system 100 of FIG. 2 in molding an intermediate encapsulation 424. The first integrated circuit 204 mounts over a carrier strip 426, such as a laminated substrate, which extends horizontally beyond the second carrier 214.

The second integrated circuit package system 212 can be formed and tested without assembly into the stacked integrated circuit package system 100. This can ensure known good device (KGD) for the second integrated circuit package system 212 resulting in improved yield of the stacked integrated circuit package system 100.

The intermediate encapsulation 424 can be molding between the carrier strip 426 and the second carrier 214 to surround the intra-stack interconnects 216. The intermediate encapsulation 424 is also shown, for example, along a side 428 of the top encapsulation 102. The intermediate encapsulation 424 is formed between the carrier strip 426 and the second carrier 214 and is formed around the intra-stack interconnects 216. The intermediate encapsulation 424 also has the characteristics of being formed between the carrier strip 426 and the second carrier 214. The structure with the carrier strip 426 can be singulated removing the intermediate encapsulation 424 from the side 428 of the top encapsulation 102. The singulation process can also cut the carrier strip 426 to the first carrier 206 of FIG. 2 forming the stacked integrated circuit package system 100 of FIG. 2. The external interconnects 210 can be attached to the second carrier 214.

Figure 5:
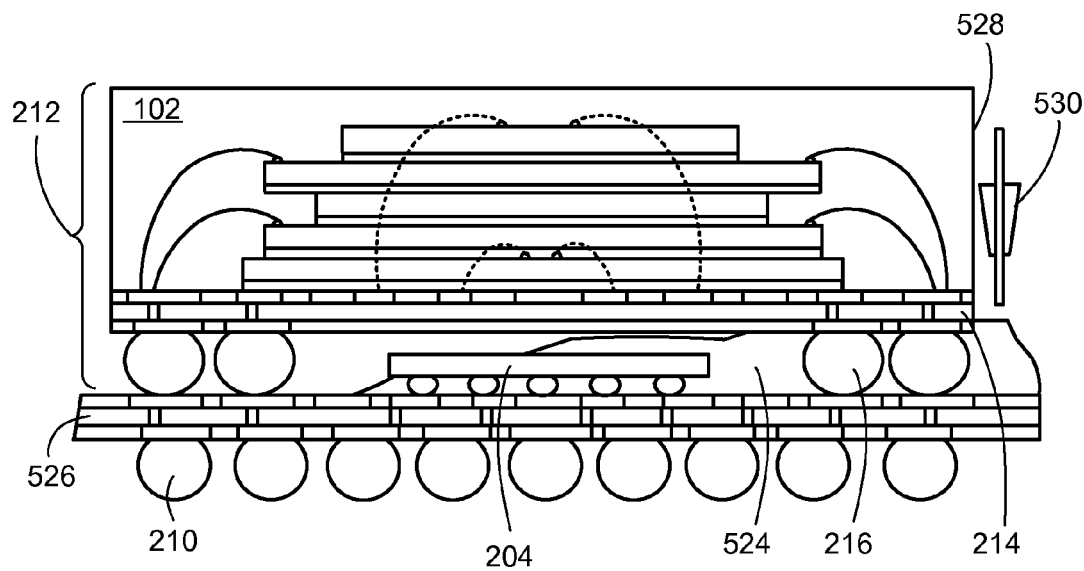
FIG. 5 is a cross-sectional view of the stacked integrated circuit package system of FIG. 2 in filling an intermediate encapsulation.

Referring now to FIG. 5, therein is shown a cross-sectional view of the stacked integrated circuit package system 100 of FIG. 2 in filling an intermediate encapsulation 524. The first integrated circuit 204 mounts over a carrier strip 526, such as a laminated substrate, which extends horizontally beyond the second carrier 214.

The second integrated circuit package system 212 can be formed and tested without assembly into the stacked integrated circuit package system 100. This can ensure known good device (KGD) for the second integrated circuit package system 212 resulting in improved yield of the stacked integrated circuit package system 100.

A capillary 530 can fill the intermediate encapsulation 524 between the carrier strip 526 and the second carrier 214 to surround the intra-stack interconnects 216. The intermediate encapsulation 524 is shown, for example, not along a side 528 of the top encapsulation 102. The structure with the carrier strip 526 can be singulated removing the intermediate encapsulation 524 over the carrier strip 526 not under the second carrier 214 forming the first carrier 206 of FIG. 2 and forming the stacked integrated circuit package system 100 of FIG. 2. The external interconnects 210 can be attached to the second carrier 214.

Figure 6:
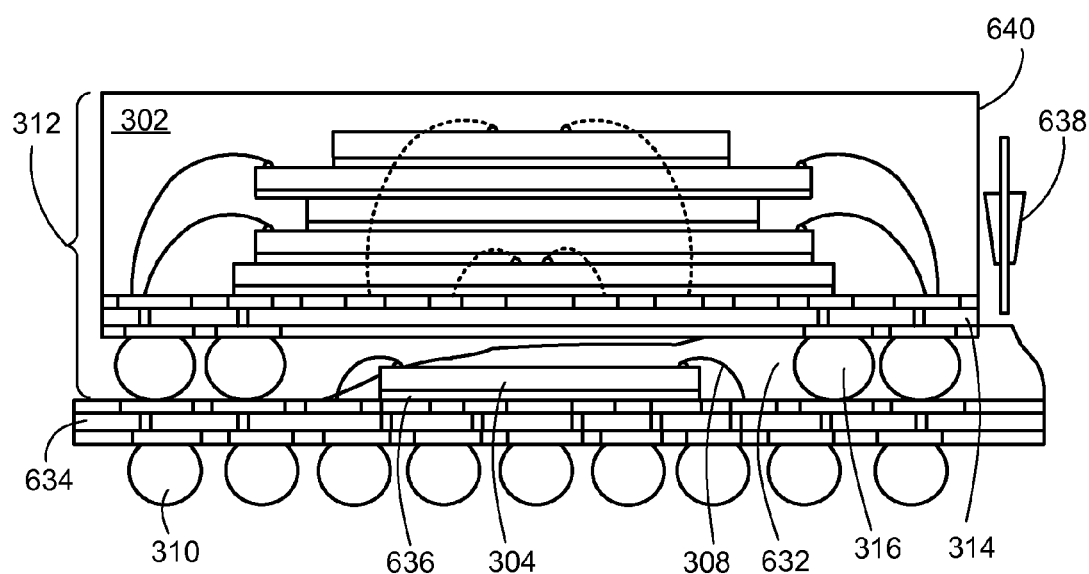
FIG. 6 is a cross-sectional view of the stacked integrated circuit package system of FIG. 3 in filling an intermediate encapsulation.

Referring now to FIG. 6, therein is shown a cross-sectional view of the stacked integrated circuit package system 300 of FIG. 3 in filling an intermediate encapsulation 632. The first integrated circuit 304 mounts over a carrier strip 634, such as a laminated substrate, with an adhesive 636, such as die-attach adhesive. The carrier strip 634 can extends horizontally beyond the second carrier 314. The first interconnects 308 can connect the first integrated circuit 304 and the carrier strip 634.

The second integrated circuit package system 312 can be formed and tested without assembly into the stacked integrated circuit package system 300. This can ensure known good device (KGD) for the second integrated circuit package system 312 resulting in improved yield of the stacked integrated circuit package system 300.

A capillary 638 can fill the intermediate encapsulation 632 between the carrier strip 634 and the second carrier 314 to surround the intra-stack interconnects 316. The intermediate encapsulation 632 is shown, for example, not along a side 640 of the top encapsulation 302. The structure with the carrier strip 634 can be singulated removing the intermediate encapsulation 632 over the carrier strip 634 not under the second carrier 314 forming the first carrier 306 of FIG. 3 and forming the stacked integrated circuit package system 300 of FIG. 3. The external interconnects 310 can be attached to the second carrier 314.

Figure 7:
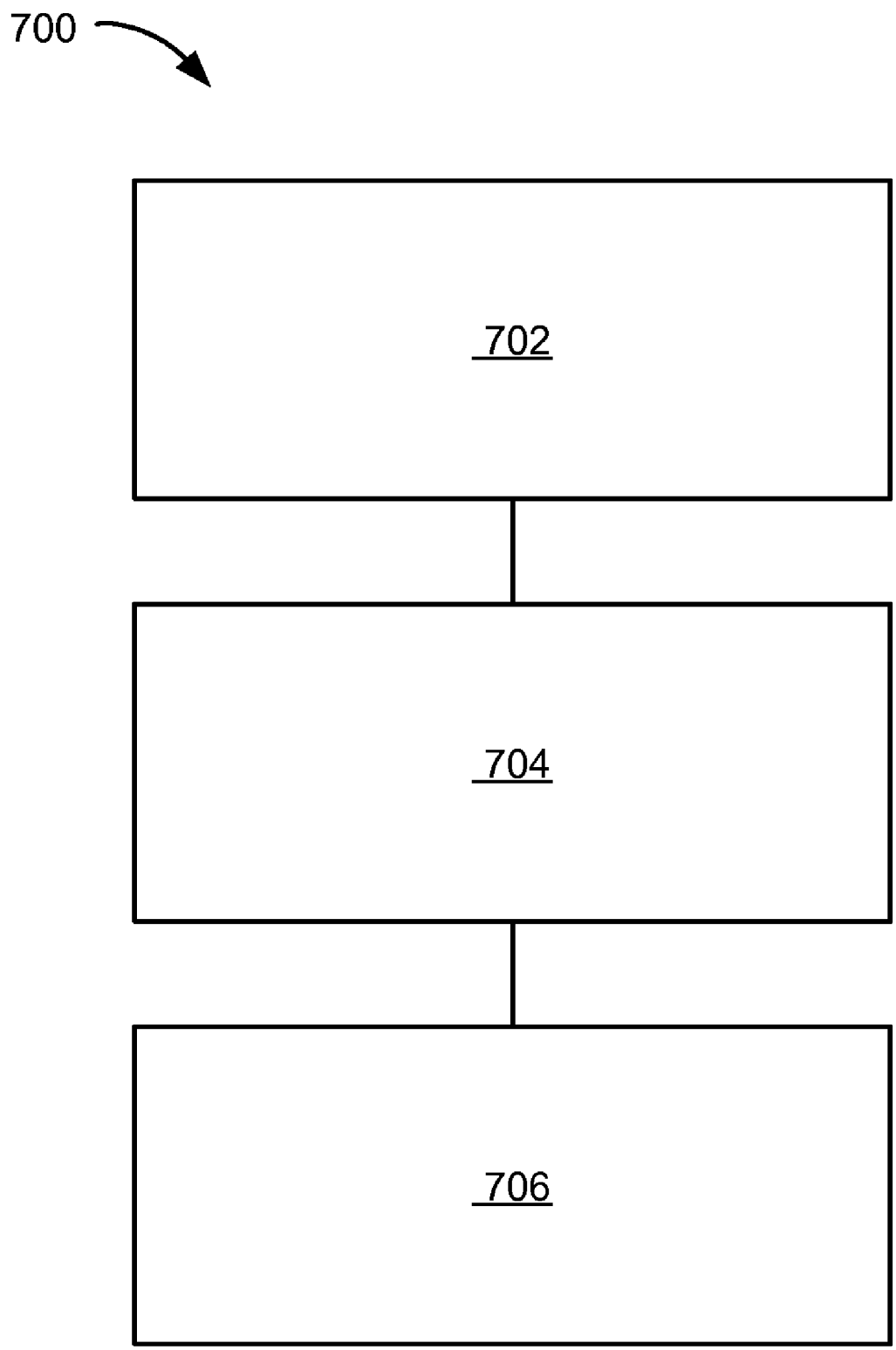
FIG. 7 is a flow chart of a stacked integrated circuit package system for manufacturing of the stacked integrated circuit package system in an embodiment of the present invention.

Referring now to FIG. 7, therein is shown a flow chart of a stacked integrated circuit package system 700 for manufacturing the stacked integrated circuit package system 100 in an embodiment of the present invention. The system 700 includes mounting a first integrated circuit over a first carrier in a block 702; mounting a second integrated circuit package system having a second carrier with an intra-stack interconnect attached thereto and with the intra-stack interconnect over the first carrier and the first integrated circuit in a block 704; and forming an intra-stack encapsulation between the first carrier and the second carrier surrounding the intra-stack interconnect in a block 706.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stacked integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a stacked integrated circuit package system comprising:
mounting a first integrated circuit over a first carrier;
mounting a second integrated circuit package system having a second carrier with an intra-stack interconnect attached thereto and with the intra-stack interconnect directly on the first carrier adjacent the first integrated circuit; and forming an intra-stack encapsulation between the first carrier and the second carrier, surrounding the intra-stack interconnect and in an entire space between the first carrier and the second carrier, and the intra-stack encapsulation is the same thickness between the first carrier and the second carrier as the intra-stack interconnect.

2. The method as claimed in claim 1 wherein forming the intra-stack encapsulation between the first carrier and the second carrier includes molding the intra-stack encapsulation.

3. The method as claimed in claim 1 further comprising forming the second integrated circuit package system including:

mounting a second integrated circuit over the second carrier; and forming a top encapsulation over the second integrated circuit and the second carrier.

4. The method as claimed in claim 1 wherein forming the intra-stack encapsulation between the first carrier and the second carrier includes molding an underfill.

5. A method for manufacturing a stacked integrated circuit package system comprising:

mounting a first integrated circuit over a first carrier;

connecting the first integrated circuit over the first carrier;

mounting a second integrated circuit package system having a second carrier with an intra-stack interconnect attached thereto and with the intra-stack interconnect directly on the first carrier adjacent the first integrated circuit;

forming an intra-stack encapsulation in an entire space between the first carrier and the second carrier surrounding the intra-stack interconnect, and the intra-stack encapsulation is the same thickness between the first carrier and the second carrier as the intra-stack interconnect; and attaching an external interconnect below and to the first carrier.

6. The method as claimed in claim 5 further comprising forming the second integrated circuit package system having a top encapsulation not in contact with the intra-stack encapsulation.

7. The method as claimed in claim 5 wherein mounting the second integrated circuit package system over the first carrier and the first integrated circuit includes mounting the intra-stack interconnect adjacent to the first integrated circuit.

8. The method as claimed in claim 5 wherein forming the intra-stack encapsulation includes filling a space between the first carrier and the second carrier.

9. The method as claimed in claim 5 wherein attaching the external interconnect includes attaching solder ball.

10. A stacked integrated circuit package system comprising:

a first carrier;

a first integrated circuit over the first carrier;

a second integrated circuit package system having a second carrier with an intra-stack interconnect attached thereto and with the intra-stack interconnect directly on the first carrier adjacent the first integrated circuit; and an intra-stack encapsulation having characteristics of being formed between the first carrier and the second carrier and the intra-stack encapsulation surrounds the intra-stack interconnect and fills the entire space between the first carrier and the second carrier, and the intra-stack encapsulation is the same thickness between the first carrier and the second carrier as the intra-stack interconnect.

11. The system as claimed in claim 10 wherein the second integrated circuit package system having the second carrier with the intra-stack interconnect attached thereto includes the intra-stack interconnect below the second carrier.

12. The system as claimed in claim 10 wherein the intra-stack interconnect is between the first carrier and the second carrier.

13. The system as claimed in claim 10 wherein the second integrated circuit package system includes:

a second integrated circuit over the second carrier; and a top encapsulation over the second integrated circuit and the second carrier.

14. The system as claimed in claim 10 wherein the intra-stack encapsulation includes an underfill.

15. The system as claimed in claim 10 wherein:

the first integrated circuit is connected with the first carrier; and further comprising:

an external interconnect connected below and to the first carrier.

16. The system as claimed in claim 15 wherein the second integrated circuit package system includes a top encapsulation not in contact with the intra-stack encapsulation.

17. The system as claimed in claim 15 wherein the second integrated circuit package system over the first carrier and the first integrated circuit includes the intra-stack interconnect adjacent to the first integrated circuit.

18. The system as claimed in claim 15 wherein the intra-stack encapsulation fills a space between the first carrier and the second carrier.

19. The system as claimed in claim 15 wherein the external interconnect includes attaching solder ball.

* * * * *

UNITED STATES PATENT AND TRADEMARK OFFICE
CERTIFICATE OF CORRECTION

| | | |
|---|---|---|
| PATENT NO. | : 7,871,861 B2 | Page 1 of 1 |
| APPLICATION NO. | : 12/146411 | |
| DATED | : January 18, 2011 | |
| INVENTOR(S) | : Song et al. | |

It is certified that error appears in the above-identified patent and that said Letters Patent is hereby corrected as shown below:

Column 3:

Line 48, delete "surrounds" and insert therefor --surround--

Lines 49-50, delete "216. The" and insert therefor --216 attached or connected directly on the first carrier 206 and adjacent or next to the first integrated circuit 204. The--

Signed and Sealed this
Twenty-fourth Day of May, 2011

David J. Kappos
*Director of the United States Patent and Trademark Office*